United States Patent
Kartschoke et al.

(10) Patent No.: US 6,891,419 B2
(45) Date of Patent: May 10, 2005

(54) METHODS AND APPARATUS FOR EMPLOYING FEEDBACK BODY CONTROL IN CROSS-COUPLED INVERTERS

(75) Inventors: Paul D. Kartschoke, Williston, VT (US); Stephen V. Kosonocky, Wilton, CT (US); Randy W. Mann, Poughquag, NY (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,554

(22) Filed: Jul. 30, 2003

(65) Prior Publication Data

US 2005/0024113 A1 Feb. 3, 2005

(51) Int. Cl.⁷ .............................................. H03K 3/356
(52) U.S. Cl. ...................................... 327/208; 327/219
(58) Field of Search ............................ 327/54–55, 57, 327/67, 206, 208, 210, 214–215, 219, 222, 228, 534, 562

(56) References Cited

U.S. PATENT DOCUMENTS

| | | | |
|---|---|---|---|
| 4,852,060 A | 7/1989 | Rockett, Jr. ................. | 365/154 |
| 4,914,629 A | 4/1990 | Blake et al. ................. | 365/154 |
| 4,956,814 A | 9/1990 | Houston ...................... | 365/154 |
| 5,310,694 A | 5/1994 | Houston ...................... | 438/153 |
| 5,631,863 A | 5/1997 | Fechner et al. ............. | 365/156 |
| 5,905,290 A | 5/1999 | Houston ...................... | 257/380 |
| 6,037,808 A * | 3/2000 | Houston et al. .............. | 327/55 |
| 6,222,394 B1 * | 4/2001 | Allen et al. .................. | 327/52 |
| 6,252,429 B1 * | 6/2001 | Assaderaghi et al. ......... | 327/55 |
| 6,608,789 B2 * | 8/2003 | Sullivan et al. ............. | 365/205 |

* cited by examiner

Primary Examiner—My-Trang Nu Ton
(74) Attorney, Agent, or Firm—Richard A. Henkler; Dugan & Dugan, P.C.

(57) ABSTRACT

In a first aspect, a cross-coupled inverter is provided that includes a first inverter circuit having a first NFET coupled to a first PFET and a second inverter circuit having a second NFET coupled to a second PFET. The second inverter circuit is cross-coupled with the first inverter circuit at a plurality of nodes. The body of at least one of the first NFET, the second NFET, the first PFET and the second PFET is coupled so as to form a feedback path that reduces discharging at one or more of the plurality of nodes in response to a soft error event at the cross-coupled inverter.

15 Claims, 4 Drawing Sheets

METHODS AND APPARATUS FOR EMPLOYING FEEDBACK BODY CONTROL IN CROSS-COUPLED INVERTERS

BACKGROUND OF INVENTION

Field of the Invention

The present invention relates generally to cross-coupled inverter circuits, and more particularly to methods and apparatus for employing feedback body control in cross-coupled inverters.

Cross-coupled inverters are often employed as storage elements in complementary metal oxide semiconductor (CMOS) logic such as latches, flip flops, SRAMS, etc. For example, FIG. 1A is a schematic diagram of a conventional cross-coupled inverter circuit 100.

With reference to FIG. 1A, the cross-coupled inverter circuit 100 includes a first inverter circuit 102 cross-coupled to a second inverter circuit 104. That is, an output of the first inverter circuit 102 is coupled to an input of the second inverter circuit 104, as indicated by node A, and an input of the first inverter circuit 102 is coupled to an output of the second inverter circuit 104 as indicated by node B.

As shown in FIG. 1A, the first inverter circuit 102 includes a first n-channel metal-oxide-semiconductor field effect transistor (NFET) 106 coupled to a first p-channel MOSFET (PFET) 108. Specifically, the drains of the NFET 106 and PFET 108 are coupled at node A, and the gates of the NFET 106 and PFET 108 are coupled at node B. The source and body of the NFET 106 are grounded, and the source and body of the PFET 108 are tied to a rail voltage (e.g., $V_{DD}$).

The second inverter circuit 104 includes a second NFET 110 coupled to a second PFET 112. Specifically, the drains of the NFET 110 and PFET 112 are coupled at node B, and the gates of the NFET 110 and PFET 112 are coupled at node A. The source and body of the NFET 110 are grounded, and the source and body of the PFET 112 are tied to a rail voltage (e.g., $V_{DD}$).

Referring to FIG. 1A, the cross-coupled inverter circuit 100 is shown in a steady-state condition in which the voltage at node A is approximately $V_{DD}$ (e.g., a high or 1 logic state) and the voltage at node B is approximately 0 (e.g., a low or 0 logic state). With node B low, the first NFET 106 is OFF and the first PFET 108 is ON; and with node A high, the second NFET 110 is ON, and the second PFET 112 is OFF. With the first NFET 106 OFF and the first PFET 108 ON, node A is pulled (or held) high via the channel of the first PFET 108. Likewise, with the second NFET 110 ON and the second PFET 112 OFF, node B is pulled (or held) low via the channel of the second NFET 110.

During normal operation, the cross-coupled inverter circuit 100 should maintain the above-logic state until intentionally switched, and may be employed as a simple storage element (e.g., by using a pass-gate or similar device to read out the logic state as is known in the art). However, as device dimensions shrink, the storage capacitances associated with nodes A and B are reduced and the cross-coupled inverter circuit 100 becomes increasingly vulnerable to soft error (SE) events.

SE events may include, for example, alpha particle collisions or similar energetic particles or charge generating sources/events that may affect the charge balance in one or more of the FETs 106–112. For instance, if an SE event occurs at the first NFET 106 (as indicated by reference numeral 114), electron-hole pairs may be generated within the body region of the first NFET 106. To counteract any corresponding charge imbalance, charge may be swept into the body region of the first NFET 106 from node A and discharge node A accordingly (e.g., via the relationship $V=dQ/C$, where C is the capacitance of node A). As device dimensions shrink, the capacitance of node A decreases, and the amount by which node A discharges in response to an SE event increases.

FIG. 1B illustrates an exemplary voltage profile for node A in response to an SE event at the first NFET 106 of the conventional cross-coupled inverter circuit 100 of FIG. 1A. As shown in FIG. 1B, if the SE event is large enough and/or if the capacitance of node A is small enough, the voltage at node A may be significantly discharged. As the voltage of node A discharges, eventually the second PFET 112 begins to turn ON, node B is pulled high and the first NFET 106 turns ON (discharging node A and switching the logic state of the cross-coupled inverter circuit 100). Any information stored by the cross-coupled inverter circuit 100 thereby may be inadvertently lost. Such SE induced switching is exacerbated for conventional silicon-on-insulator (SOI) cross-coupled inverters in which the body connections of the first NFET 106 and the second NFET 110 generally are left floating. In such an embodiment, the charge injected into the drain of the first NFET 106 in response to an SE event is amplified by parasitic bipolar effects of the SOI NFET 106. A large drain-source current thereby results in the first NFET 106, discharging node A even more rapidly.

Accordingly, a need exists for improved cross-coupled inverters circuits, particularly for cross-coupled inverters that employ SOI devices.

SUMMARY OF INVENTION

In a first aspect of the invention, a cross-coupled inverter is provided that includes a first inverter circuit having a first NFET coupled to a first PFET and a second inverter circuit having a second NFET coupled to a second PFET. The second inverter circuit is cross-coupled with the first inverter circuit at a plurality of nodes. The body of at least one of the first NFET, the second NFET, the first PFET and the second PFET is coupled so as to form a feedback path that reduces discharging at one or more of the plurality of nodes in response to a soft error event at the cross-coupled inverter.

In a second aspect of the invention, a method is provided that includes the steps of providing a cross-coupled inverter that includes a first inverter circuit having a first NFET coupled to a first PFET and a second inverter circuit having a second NFET coupled to a second PFET. The second inverter circuit is cross-coupled with the first inverter circuit at a plurality of nodes. The method further includes the step of coupling the body of at least one of the first NFET, the second NFET, the first PFET and the second PFET so as to form a feedback path that reduces discharging at one or more of the plurality of nodes in response to a soft error event at the cross-coupled inverter. Numerous other aspects are provided.

Other features and aspects of the present invention will become more fully apparent from the following detailed description, the appended claims and the accompanying drawings.

DETAILED DESCRIPTION

In one or more embodiments of the invention, various connections are provided between the NFETs and PFETs of a cross-coupled inverter circuit to increase the robustness of the cross-coupled inverter circuit to soft errors. In particular, feedback body control may be employed to increase soft error robustness. Exemplary feedback body control configurations for a cross-coupled inverter circuit provided in accordance with the present invention include (1) directly and/or resistively coupling the body of an NFET, PFET to a drain of the NFET, PFET as described below with reference to FIGS. 2A and 2B; (2) coupling the body of an NFET of a first inverter circuit to the body of an NFET of a second inverter circuit as described below with reference to FIGS. 3A and 3B; and (3) capacitively coupling the body of an NFET, PFET to a drain of the NFET, PFET as described below with reference to FIGS. 4A and 4B. Other embodiments are provided.

First Exemplary Cross-coupled Inverter Circuit

Figure 1A:
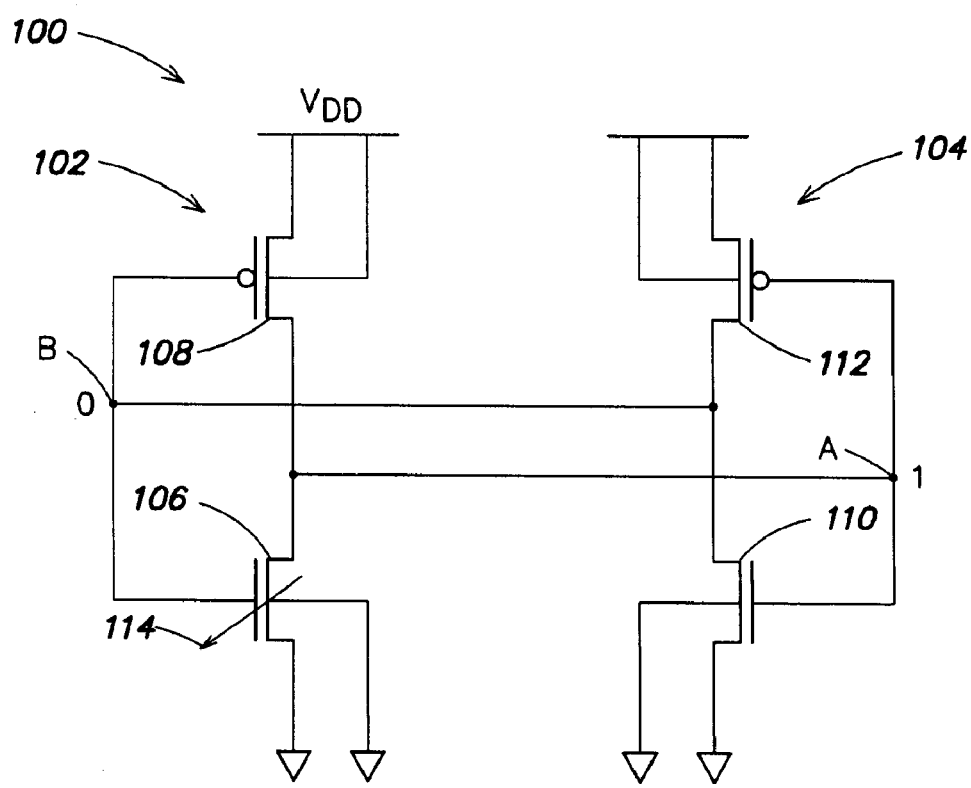
FIG. 1A is a schematic diagram of a conventional cross-coupled inverter circuit.
Figure 1B:
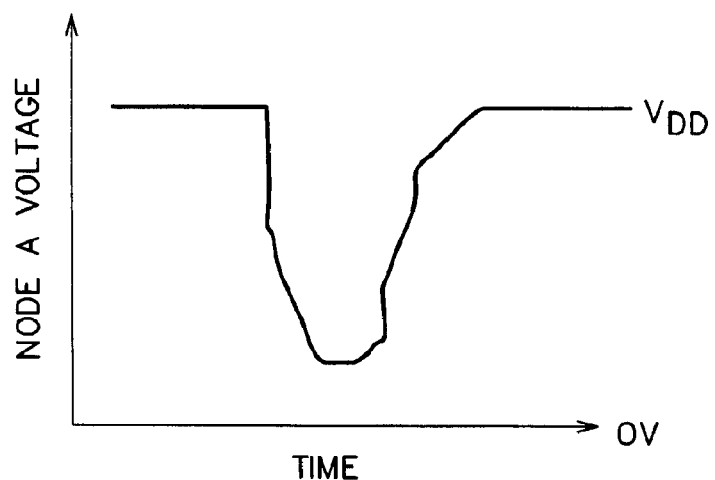
FIG. 1B illustrates an exemplary voltage profile for a node in response to an SE event in a first NFET of the conventional cross-coupled inverter circuit of FIG. 1A.
Figure 2A:
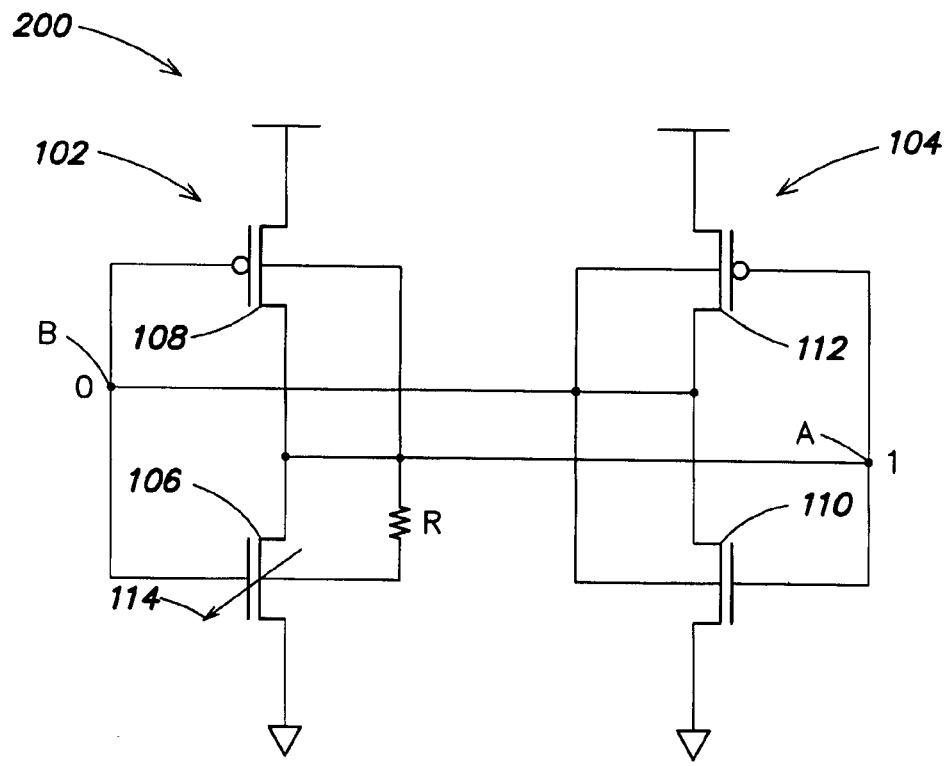
FIG. 2A is a schematic diagram of a first exemplary cross-coupled inverter circuit provided in accordance with the present invention.

FIG. 2A is a schematic diagram of a first exemplary cross-coupled inverter circuit 200 provided in accordance with the present invention. The cross-coupled inverter circuit 200 of FIG. 2A is similar to the conventional cross-coupled inverter circuit 100 of FIG. 1A, with the exception that the body and drain of the first NFET 106 and the body and drain of the first PFET 108 are coupled together (and to the node A). Likewise, the body and drain of the second NFET 110 and the body and drain of the second PFET 112 are coupled together (and to the node B).

In such an embodiment, the body-drain junction of the first NFET 106 is maintained at zero volts. Accordingly, if an SE event occurs at the first NFET 106 (as indicated by reference numeral 114), no reverse bias potential exists between the drain-body region of the first NFET 106 to sweep charge into the drain of the first NFET 106 (from node A). Accordingly, the first NFET 106 and the second PFET 112 remain OFF, while the first PFET 108 and the second NFET 110 remain OFF so that the logic state of the cross-coupled inverter circuit 100 remains unchanged.

Note that in the above described configuration, a voltage drop may exist between the body and source of the first NFET 106. Such a voltage drop typically will not affect the logic state of the cross-coupled inverter circuit 200, but may increase the leakage current through the first NFET 106. In one or more embodiments of the invention, a resistor R between the body and the drain of the first NFET 106 may be employed to limit this leakage current without affecting the SE robustness of the cross-coupled inverter circuit 200 (e.g., by reducing the voltage drop across the body-source region). A similar resistive coupling may be employed between the body/drain of the NFET 110 and the PFETs 108, 112.

Figure 2B:
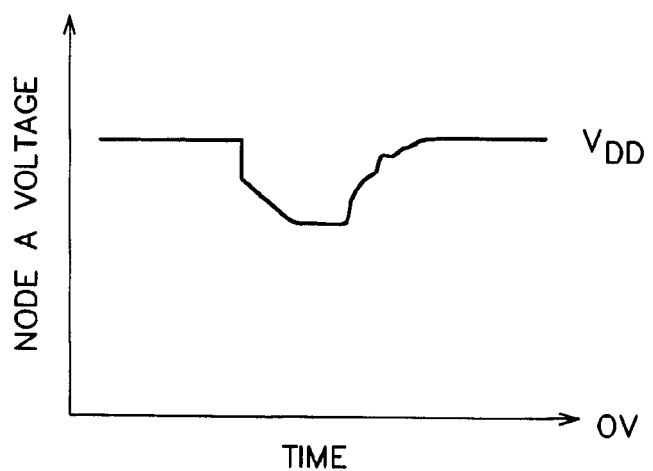
FIG. 2B illustrates an exemplary voltage profile for a node in response to an SE event in the first NFET of the first exemplary cross-coupled inverter circuit of FIG. 2A.

FIG. 2B illustrates an exemplary voltage profile for node A in response to an SE event at the first NFET 106 of the first exemplary cross-coupled inverter circuit 200 of FIG. 2A. As shown in FIG. 2B, an SE event at the first NFET 106 of the first exemplary cross-coupled inverter circuit 200 of FIG. 2A has a much smaller affect on the voltage of node A than a comparable SE event at the first NFET 106 of the conventional cross-coupled inverter circuit 100 of FIG. 1A (e.g., thereby preventing the inverter circuit 200 from inadvertently switching logic states in response to the SE event). Similar SE robustness is provided to the first and second PFETs 108, 112 and the second NFET 110 by the above-described body connections.

Second Exemplary Cross-coupled Inverter Circuit

Figure 3A:
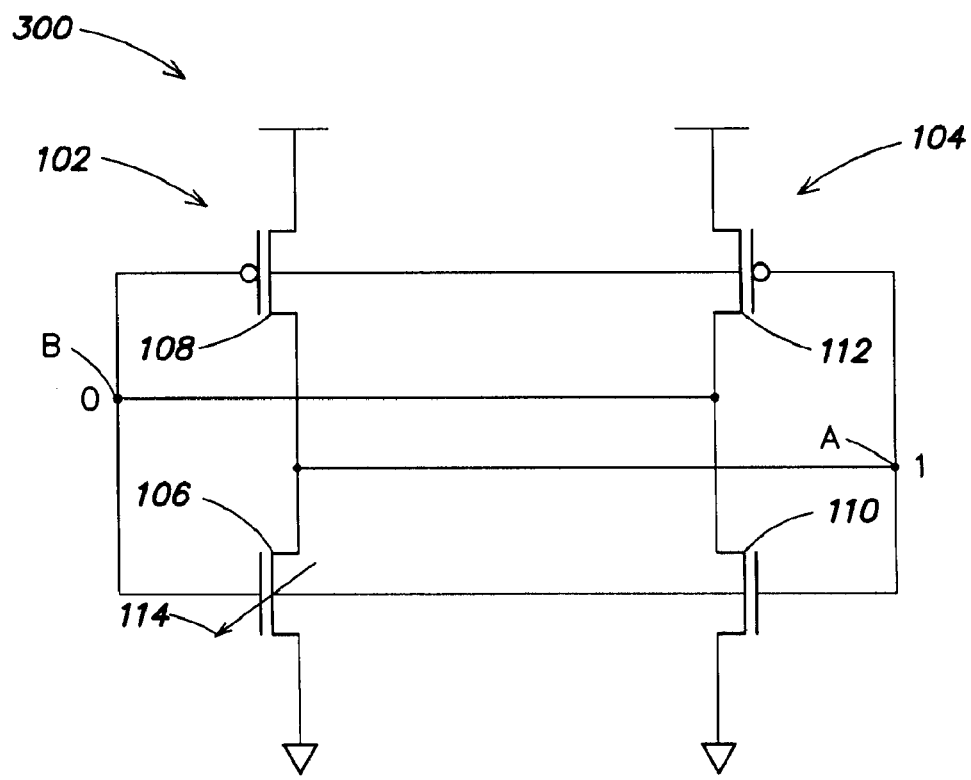
FIG. 3A is a schematic diagram of a second exemplary cross-coupled inverter circuit provided in accordance with the present invention.

FIG. 3A is a schematic diagram of a second exemplary cross-coupled inverter circuit 300 provided in accordance with the present invention. The cross-coupled inverter circuit 300 of FIG. 3A is similar to the conventional cross-coupled inverter circuit 100 of FIG. 1A, with the exception that the body of the first NFET 106 is coupled to the body of the second NFET 110, and the body the first PFET 108 is coupled to the body of the second PFET 112.

In the embodiment of FIG. 3A, an SE event at the first NFET 106 (indicated by reference numeral 114) may cause an increase in the body potential of the first NFET 106 (similar to that experienced in the conventional cross-coupled inverter circuit 100 of FIG. 1A), and node A to begin to discharge (e.g., via a parasitic bipolar effect in an SOI implementation). However, unlike in the conventional cross-coupled inverter circuit 100 of FIG. 1A, in the second exemplary cross-coupled inverter circuit 300 of FIG. 3A, any increase in body voltage at the first NFET 106 will be similarly experienced by the second NFET 110 (e.g., as the bodies of the first and second NFETs 106, 110 are coupled together). Any increase in body voltage at the second NFET 110 (which is normally ON in the state shown in FIG. 3A), decreases the threshold voltage of the second NFET 110 (e.g., proportionally). The drain-source conductance of the second NFET 110 thereby increases and node B is held more strongly at a low voltage (e.g., 0 volts) by the second NFET 110. Accordingly, the first PFET 108 remains strongly ON, and may supply current to bleed off SE induced charge within the first NFET 106; and the logic state of the second exemplary cross-coupled inverter 300 remains unchanged by the SE event.

Figure 3B:
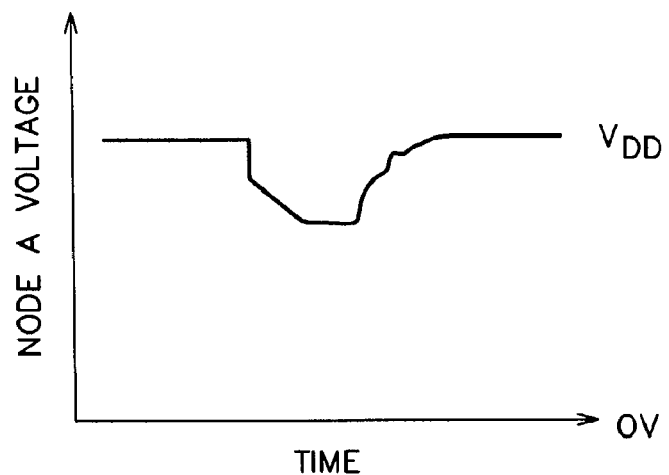
FIG. 3B illustrates an exemplary voltage profile for a node in response to an SE event in a first NFET of the second exemplary cross-coupled inverter circuit of FIG. 3A.

FIG. 3B illustrates an exemplary voltage profile for node A in response to an SE event at the first NFET 106 of the second exemplary cross-coupled inverter circuit 300 of FIG. 3A. As shown in FIG. 3B, an SE event at the first NFET 106 of the second exemplary cross-coupled inverter circuit 300 of FIG. 3A has a much smaller affect on the voltage of node A than a comparable SE event at the first NFET 106 of the conventional cross-coupled inverter circuit 100 of FIG. 1A (e.g., thereby preventing the inverter circuit 300 from inadvertently switching logic states in response to the SE event). Similar SE robustness is provided to the first and second PFETs 108, 112 and the second NFET 110 by the above-described body connections.

Third Exemplary Cross-coupled Inverter Circuit

Figure 4A:
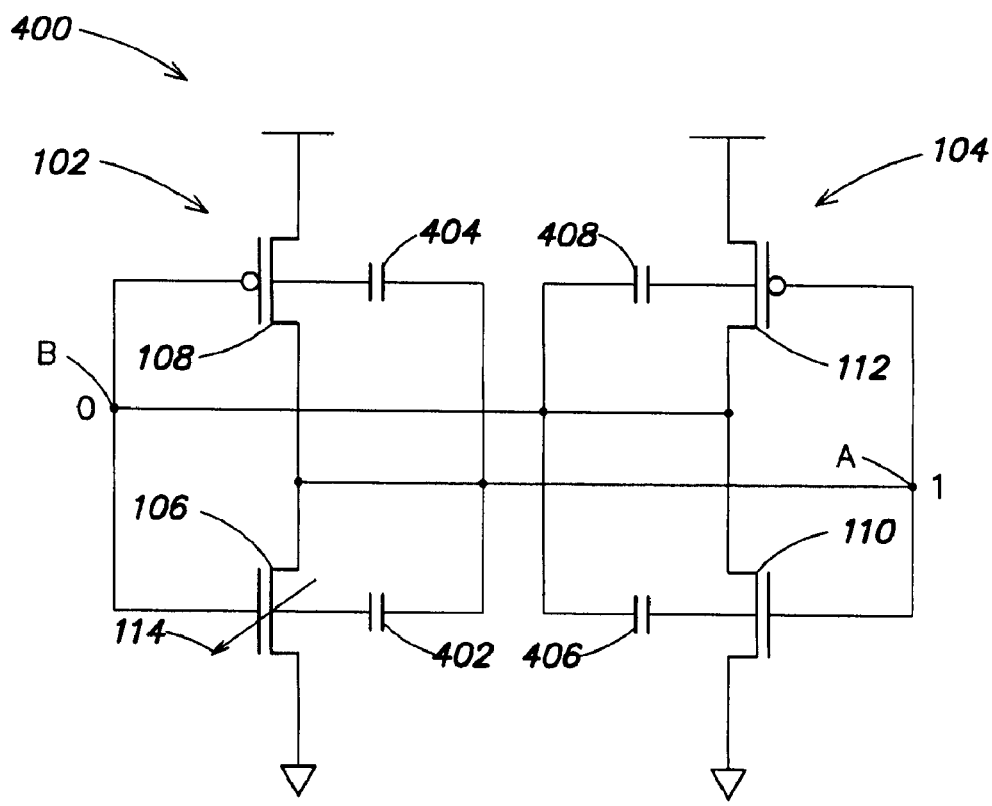
FIG. 4A is a schematic diagram of a third exemplary cross-coupled inverter circuit provided in accordance with the present invention.

FIG. 4A is a schematic diagram of a third exemplary cross-coupled inverter circuit 400 provided in accordance with the present invention. The cross-coupled inverter circuit 400 of FIG. 4A is similar to the cross-coupled inverter circuit 200 of FIG. 2A, with the exception that the body and drain of the first NFET 106 and the body and drain of the first PFET 108 are each coupled together (and to the node A) via a capacitor 402, 404, respectively. Likewise, the body and drain of the second NFET 110 and the body and drain of the second PFET 112 are each coupled together (and to the node B) via a capacitor 406, 408, respectively.

The AC-coupled body/drain feedback configuration of FIG. 4A operates similarly to the direct body/drain feedback configuration of FIG. 2A, but with reduced current leakage. Because body/drain connections are made via capacitors 402–408, in an SOI implementation of the invention, each body of each NFET 106, 110 and each PFET 108, 112 may float to its steady-state value. Thereafter, if an SE event occurs at the first NFET 106, the first NFET 106 may begin discharging node A (via a parasitic bipolar effect as previously described) through the drain of the first NFET 106. As the voltage at node A decreases, because the voltage at node A is AC-coupled (or boot-strapped) to the body of the first NFET 106 by the capacitor 402, the voltage potential of the body of the first NFET 106 is forced lower. Parasitic bipolar effects within the first NFET 106 thereby decrease. Further, because the body of the first PFET 108 is AC-coupled to node A (via capacitor 404), the body of the first PFET 108 also is pulled lower via the discharging of node A. The threshold voltage of the first PFET 108 thereby is reduced, and the first PFET 108 turns on more strongly (e.g., increasing the source-drain conductance of the first PFET 108 so as to hold node A at $V_{DD}$ more strongly).

Figure 4B:
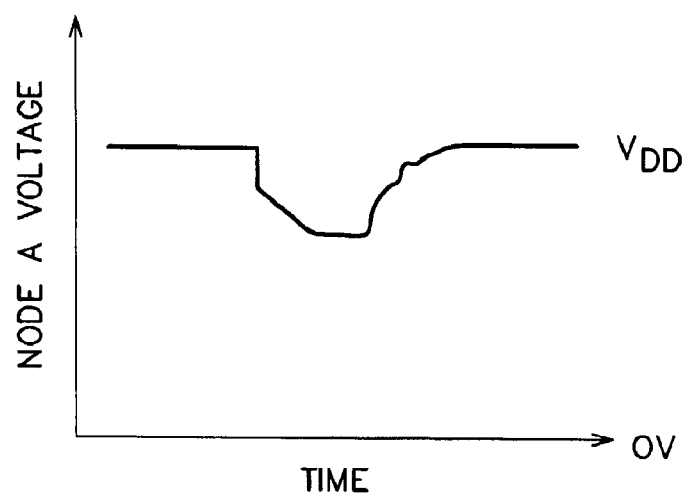
FIG. 4B illustrates an exemplary voltage profile for a node in response to an SE event in a first NFET of the third exemplary cross-coupled inverter circuit of FIG. 4A.

FIG. 4B illustrates an exemplary voltage profile for node A in response to an SE event at the first NFET 106 of the third exemplary cross-coupled inverter circuit 200 of FIG. 4A. As shown in FIG. 4B, an SE event at the first NFET 106 of the third exemplary cross-coupled inverter circuit 400 of FIG. 4A has a much smaller affect on the voltage of node A than a comparable SE event at the first NFET 106 of the conventional cross-coupled inverter circuit 100 of FIG. 1A (e.g., thereby preventing the inverter circuit 400 from inadvertently switching logic states in response to the SE event). Similar SE robustness is provided to the first and second PFETs 108, 112 and the second NFET 110 by the above-described body connections.

The foregoing description discloses only exemplary embodiments of the invention. Modifications of the above disclosed apparatus and method which fall within the scope of the invention will be readily apparent to those of ordinary skill in the art. For instance, the present invention may be implemented with any MOS devices that employ body contacts (e.g., SOI, triple well, or the like). Note that in embodiments of the invention wherein a body-to-drain connection of an NFET or PFET may cause the body to become forwarded biased (e.g., in the first cross-coupled inverter 200 of FIG. 2A), operation of the inverter at low voltages (e.g., about 0.5 V or below) may mitigate any current leakage issues. The total increase in standby leakage current may be further mitigated by powering down un-needed cross-coupled inverters when a plurality of such cross-coupled inverters are employed (e.g., within a memory array), and/or by only employing the inventive feedback body connections at sensitive nodes of cross-coupled inverters. While the present invention has been described with reference to cross-coupled CMOS inverter circuits, it will be understood that the present invention may be employed with other forms of feedback circuits such as cross-coupled NAND or NOR gates, tri-state inverters or the like.

Accordingly, while the present invention has been disclosed in connection with exemplary embodiments thereof, it should be understood that other embodiments may fall within the spirit and scope of the invention, as defined by the following claims.

What is claimed is:

1. A cross-coupled inverter comprising:
    a first inverter circuit including a first NFET coupled to a first PFET, the first NFET having a body and drain being coupled one to another, and the first PFET having a body and drain coupled one to another; and
    a second inverter circuit cross-coupled with the first inverter circuit at a plurality of nodes, the second inverter circuit including a second NFET coupled to a second PFET, the second NFET having a body and a drain coupled one to another, and the second PFET having a body and drain coupled one to another;
    wherein the body of at least one of the first NFET, the second NFET, the first PFET and the second PFET is coupled so as to form a feedback path that reduces discharging at one or more of the plurality of nodes in response to a soft error event at the cross-coupled inverter.

2. The cross-coupled inverter of claim 1 wherein the body and the drain of the first NFET are coupled to the body and the drain of the first PFET.

3. The cross-coupled inverter of claim 1 wherein the body and the drain of the second NFET are coupled to the body and the drain of the second PFET.

4. The cross-coupled inverter of claim 1 wherein the first NFET, the second NFET, the first PFET and the second PFET each comprises a silicon-on-insulator metal-oxide semiconductor field effect transistor.

5. The cross-coupled inverter of claim 1 wherein the first NFET, the second NFET, the first PFET and the second PFET each comprises a triple-well metal-oxide-semiconductor field effect transistor.

6. A cross-coupled inverter comprising:
    a first inverter circuit including a first NFET coupled to a first PFET, the first NFET having a body and drain being coupled one to another with a first capacitor, and the first PFET having a body and drain coupled one to another with a second capacitor; and
    a second inverter circuit cross-coupled with the first inverter circuit at a plurality of nodes, the second inverter circuit including a second NFET coupled to a second PFET, the second NFET having a body and a drain coupled one to another with a third capacitor, and the second PFET having a body and drain coupled one to another with a fourth capacitor;
    wherein the body of at least one of the first NFET, the second NFET, the first PFET and the second PFET is coupled so as to form a feedback path that reduces discharging at one or more of the plurality of nodes in response to a soft error event at the cross-coupled inverter.

7. The cross-coupled inverter of claim 6 wherein the drain of the first NFET is coupled to the drain of the first PFET.

8. The cross-coupled inverter of claim 6 wherein the drain of the second NFET is coupled to the drain of the second PFET.

9. The cross-coupled inverter of claim 6 wherein the first NFET, the second NFET, the first PFET and the second PFET each comprises a silicon-on-insulator metal-oxide-semiconductor field effect transistor.

10. The cross-coupled inverter of claim 6 wherein the first NFET, the second NFET, the first PFET and the second PFET each comprises a triple-well metal-oxide-semiconductor field effect transistor.

11. A method of forming a cross-coupled inverter, the method comprising the steps of:
   providing a cross-coupled inverter circuit having:
   a first inverter circuit including a first NFET coupled to a first PFET, the first NFET and first PFET each having a body and drain; and
   a second inverter circuit cross-coupled with the first inverter circuit at a plurality of nodes, the second inverter circuit including a second NFET coupled to a second PFET, the second PFET and NFET having a body and a drain;
   coupling the body and the drain of the first NFET together;
   coupling the body and the drain of the first PFET together;
   coupling the body and the drain of the second NFET together;
   coupling the body and the drain of the second PFET together; and
   coupling the body of at least one of the first NFET, the second NFET, the first PFET and the second PFET is coupled so as to form a feedback path that reduces discharging at one or more of the plurality of nodes in response to a soft error event at the cross-coupled inverter.

12. The method of claim 11 further comprising coupling the body and the drain of the first NFET to the body of the drain of the first PFET.

13. The method of claim 11 further comprising coupling the body and the drain of the second NFET to the body of the drain of the second PFET.

14. The method of claim 11 wherein coupling the body and the drain of the first NFET together comprises resistively coupling the body and the drain of the first NFET together.

15. The method of claim 11 wherein coupling the body of at least one of the first NFET, the second NFET, the first PFET and the second PFET so as to form a feedback path comprises:
   capacitively coupling the body and the drain of the first NFET;
   capacitively coupling the body and the drain of the first PFET;
   capacitively coupling the body and the drain of the second NFET; and
   capacitively coupling the body and the drain of the second PFET.

* * * * *